(12) United States Patent
Pednekar et al.

(10) Patent No.: US 11,283,479 B2
(45) Date of Patent: Mar. 22, 2022

(54) APPARATUS AND METHODS FOR RADIO FREQUENCY SIGNAL LIMITING

(71) Applicant: Analog Devices, Inc., Norwood, MA (US)

(72) Inventors: Prathamesh H. Pednekar, Woburn, MA (US); Song Lin, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 23 days.

(21) Appl. No.: 16/946,360

(22) Filed: Jun. 18, 2020

(65) Prior Publication Data

US 2021/0399757 A1  Dec. 23, 2021

(51) Int. Cl.
| | |
|---|---|
| *H04B 1/40* | (2015.01) |
| *H03K 5/08* | (2006.01) |
| *H02H 9/00* | (2006.01) |
| *H03F 1/56* | (2006.01) |
| *H03F 3/24* | (2006.01) |

(52) U.S. Cl.
CPC ............... *H04B 1/40* (2013.01); *H03F 1/565* (2013.01); *H03F 3/245* (2013.01); *H03F 2200/102* (2013.01); *H03F 2200/222* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 4,596,043 | A | * | 6/1986 | Leitch ................... H03F 1/0266 332/159 |
| 5,138,274 | A | * | 8/1992 | Nakanishi ............ H03G 3/3042 330/136 |
| 5,341,114 | A | | 8/1994 | Calviello et al. |
| 5,886,572 | A | * | 3/1999 | Myers ...................... H03C 5/00 330/10 |
| 6,049,703 | A | * | 4/2000 | Staudinger ............ H03F 1/0222 330/10 |
| 7,009,462 | B2 | * | 3/2006 | Kojima ................... H01P 1/227 327/309 |
| 7,515,000 | B1 | | 4/2009 | Jin et al. |
| 8,565,341 | B2 | * | 10/2013 | Kousai ................. H03F 3/3028 375/297 |
| 8,731,120 | B1 | | 5/2014 | Pike |

(Continued)

FOREIGN PATENT DOCUMENTS

| | | |
|---|---|---|
| CN | 109995333 A | 7/2019 |
| FR | 3048831 A1 | 9/2017 |

*Primary Examiner* — Pablo N Tran
(74) *Attorney, Agent, or Firm* — Knobbe, Martens, Olson & Bear, LLP

(57) ABSTRACT

Apparatus and methods for radio frequency (RF) signal limiting are provided. In certain embodiments, an RF signal limiting system includes a cascade of a front limiter and a biased limiter. Additionally, the front limiter provides an initial amount of limiting to an RF signal, while the biased limiter serves to further limit the RF signal. The biased limiter is adaptively biased such that the amount of limiting provided to the RF signal increases in response to an increase in the RF signal level. Such an RF signal limiting system can be used in a variety of applications, including protecting an input of a low noise amplifier (LNA).

20 Claims, 11 Drawing Sheets

(56) References Cited

U.S. PATENT DOCUMENTS

| | | | |
|---|---|---|---|
| 8,903,340 B2 | 12/2014 | Chang et al. | |
| 8,918,068 B1* | 12/2014 | Helms | H01L 27/0255 |
| | | | 455/108 |
| 9,379,675 B2 | 6/2016 | Nash et al. | |
| 10,084,416 B2 | 9/2018 | Wallis | |
| 10,171,043 B2 | 1/2019 | Nilsson | |
| 10,404,242 B1* | 9/2019 | Lappe | H03K 5/08 |
| 10,629,553 B2* | 4/2020 | Soliman | H01L 23/552 |
| 2013/0065542 A1 | 3/2013 | Proudkii | |
| 2014/0285262 A1* | 9/2014 | Kojima | H03F 1/56 |
| | | | 330/127 |
| 2017/0271281 A1* | 9/2017 | Rodriguez | G01S 7/03 |
| 2019/0296722 A1 | 9/2019 | Lu et al. | |
| 2020/0124705 A1* | 4/2020 | Buonocore | G01S 7/282 |

* cited by examiner

APPARATUS AND METHODS FOR RADIO FREQUENCY SIGNAL LIMITING

FIELD OF THE DISCLOSURE

Embodiments of the invention relate to electronic systems, and more particularly, to signal limiting systems for radio frequency electronics.

BACKGROUND

A radio frequency (RF) communication system can include one or more amplifiers for amplifying RF signals. For example, a low noise amplifier (LNA) can be used in an RF communication system to amplify relatively weak signals received by an antenna. The LNA can operate to provide initial amplification in a receive path to increase signal-to-noise ratio (SNR) of the received signal by providing gain to the signal while introducing a relatively small amount of noise. Examples of RF communication systems with one or more LNAs include, but are not limited to, base stations, mobile devices (for instance, smartphones or handsets), laptop computers, tablets, and wearable electronics.

During operation of an RF communication system, an LNA or other amplifier can be exposed to large signal conditions. For instance, presence of a blocker or jammer signal can lead to large input signal conditions for an LNA.

SUMMARY OF THE DISCLOSURE

Apparatus and methods for radio frequency (RF) signal limiting are provided. In certain embodiments, an RF signal limiting system includes a cascade of a front limiter and a biased limiter. Additionally, the front limiter provides an initial amount of limiting to an RF signal, while the biased limiter serves to further limit the RF signal. The biased limiter is adaptively biased such that the amount of limiting provided to the RF signal increases in response to an increase in the RF signal level. Such an RF signal limiting system can be used in a variety of applications, including protecting an input of a low noise amplifier (LNA).

In one aspect, a radio frequency (RF) system with adaptive signal limiting is provided. The RF system includes a front limiter including an input configured to receive an RF signal and an output configured to provide a first limited RF signal, and a biased limiter including an input configured to receive the first limited RF signal and an output configured to provide a second limited RF signal. An amount of limiting provided by the biased limiter is controlled by a bias signal that changes in relation to a signal level of the RF signal.

In another aspect, a method of RF signal limiting is provided. The method includes limiting an RF signal to generate a first limited RF signal using a front limiter, limiting the first limited RF signal to generate a second limited RF signal using a biased limiter, and controlling an amount of limiting provided by the biased limiter using a bias signal that changes in relation to a signal level of the RF signal.

In another aspect, an RF transceiver is provided. The RF transceiver includes an antenna access circuit having an antenna port, a receive port, and a transmit port, a power amplifier having an output connected to the transmit port of the antenna access circuit, and an RF limiting system comprising a front limiter configured to receive an RF signal from the receive port of the antenna access circuit and to provide a first limited RF signal, and a biased limiter including an input configured to receive the first limited RF signal and an output configured to provide a second limited RF signal. An amount of limiting provided by the biased limiter is controlled by a bias signal that changes in relation to a signal level of the RF signal.

DETAILED DESCRIPTION OF EMBODIMENTS

Figure 1:
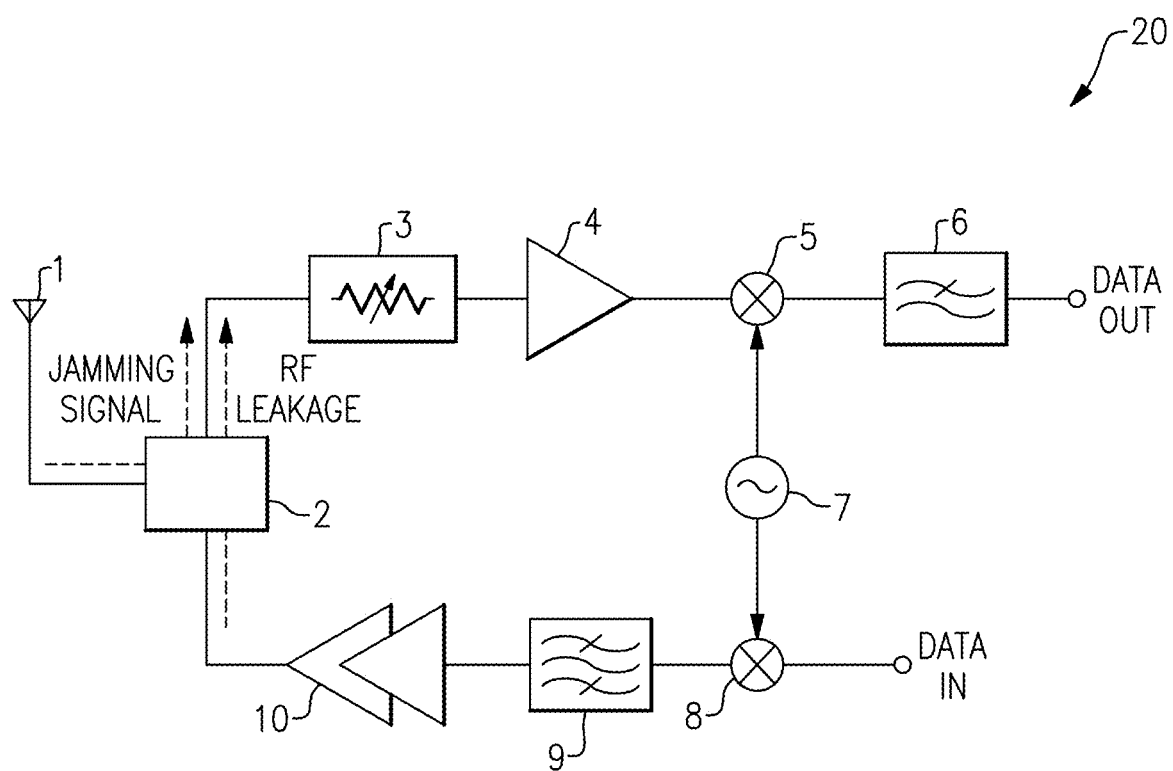
FIG. 1 is a schematic diagram of a radio frequency (RF) transceiver according to one embodiment.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system, such as an RF transceiver, communicates by wirelessly transmitting and receiving RF signals. To provide amplification to a relatively weak RF signal received from an antenna, the RF communication system can include a low noise amplifier (LNA). The LNA can provide amplification to the RF signal while introducing a relatively small amount of noise, thereby enhancing signal-to-noise ratio (SNR) and allowing the RF communication system to receive signals at far distances, in noisy radio environments, and/or from relatively weak transmitters.

Although an LNA typically provides amplification to weak signals of low power, in some applications an LNA can receive a relatively strong input signal at certain instances. For example, the LNA may receive a blocker or jammer signal having a relatively large power. Furthermore, finite isolation between a transmit path and a receive path can lead to a large amount of RF leakage reaching an input of the LNA.

Absent a protection mechanism, the large input signal can damage the LNA and/or circuitry downstream from the LNA. For example, high power signals can lead to damage of power sensitive circuitry due to overvoltage conditions, such as voltage levels greater than the maximum allowable voltages for transistors. Furthermore, high power signals can increase die temperature and lead to punch-through, junction damage, metal damage and/or surface charge accumulation.

Moreover, a large input signal can lead to amplifier compression, changes to biasing levels, and/or other undesirable behavior that can take the amplifier a considerable time to recover from. Furthermore, high power signals can induce latch-up, thereby disrupting the functioning of the chip and potentially causing permanent damage.

Apparatus and methods for RF signal limiting are provided herein. In certain embodiments, an RF signal limiting system includes a cascade of a front limiter and a biased limiter. Additionally, the front limiter provides an initial amount of limiting to an RF signal, while the biased limiter serves to further limit the RF signal. The biased limiter is adaptively biased such that the amount of limiting provided to the RF signal increases in response to an increase in the RF signal level. Such an RF signal limiting system can be used in a variety of applications, including protecting an input of an LNA.

By implementing the RF signal limiting system with both the front limiter and the biased limiter, robust signal limiting is provided. For example, the front limiter serves to provide initial RF signal limiting, while the biased limiter fail-safes the front limiter by providing additional limiting that changes with the RF signal level.

The RF signal limiting systems herein can have a flat leakage response in which output power saturates at a certain input power. In contrast, a conventional fixed bias limiter provides insufficient power reduction such that the output signal may nevertheless have high output power and cause damage to downstream circuitry as the input power increases. Without overdesigning the fixed bias limiter at the expense of higher insertion loss and noise figure, variation in the supply voltage and/or bias current can make it difficult to select a suitable amount of input signal limiting to ensure that the output power does not reach a level that can cause damage and/or interfere with operation.

In certain implementations, the biased limiter is biased using an envelope signal generated using a closed-loop topology. In one example, in a feedback arrangement, the RF signal limiting system is used to protect an input of an LNA, and a sensed output signal of the LNA is processed by an envelope detector to generate an envelope signal for biasing the biased limiter. In this way, no extra coupling loss will be added to the noise figure (NF) of the LNA, with only a sacrifice of a small portion of the LNA's output power. In another example, a feedforward arrangement is used, in which the RF signal inputted to the front limiter is sensed, and the sensed RF signal is processed by an envelope detector to generate the envelope signal for biasing the biased limiter. In this way, no LNA output power is compromised, with only a sacrifice of a small portion of the LNA's NF.

To provide sensing of the RF signal in a closed-loop topology, an RF coupler can be included. Such an RF coupler can be included at an output of an LNA or at an input to the front limiter, based on whether a feedback configuration or a feedforward configuration is used. In certain implementations, the RF coupler is integrated with an output matching network or input matching network, thereby reducing component count, lowering insertion loss, and/or improving noise figure.

In certain implementations, the LNA is implemented with a low pass filtering network and/or a high pass filtering network to aid in attenuating undesired out-of-band signals, such as jammer signals. For example, to filter high frequency jammer signals, a low pass filtering network can be included, while a high pass filtering network can be included to filter low frequency jammer signals. Such filtering networks can be included, for example, before the front limiter or at the interface between the biased limiter and an LNA. In certain implementations, an inductance of a filtering network is implemented in all or part using a through line of an RF coupler used for sensing RF signal level.

To isolate biasing of the front limiter and the biased limiter, a DC blocking capacitor can be included along the RF signal path between the front limiter and the biased limiter. By including the DC blocking capacitor, adaptive biasing of the biased limiter has little to no impact on operation of the front limiter, which can have static bias or no bias.

The RF signal limiters herein can be fabricated using a wide variety of processing technologies. Such technologies can include not only silicon technologies, such as silicon-on-insulator (SOI), but also compound semiconductor technologies such as gallium arsenide (GaAs) or gallium nitride (GaN).

FIG. 1 is a schematic diagram of an RF transceiver 20 according to one embodiment. The RF transceiver 20 includes an antenna 1, an antenna access circuit 2, an RF limiting system 3, an LNA 4, a downconverting mixer 5, a low pass filter 6, a local oscillator 7, an upconverting mixer 8, a bandpass filter 9, and a power amplifier 10. The RF limiting system 3 can be implemented in accordance with any of the embodiments herein.

Although, the RF transceiver 20 illustrates one example of an electronic system that can include a limiter, the teachings herein are applicable to limiters used in a wide variety of electronic systems. Additionally, although a particular configuration of components is illustrated in FIG. 1, the RF transceiver 20 can be adapted and modified in a wide variety of ways. For example, the RF transceiver 20 can include more or fewer receive paths and/or transmit paths. Additionally, the RF transceiver 20 can be modified to include more or fewer components and/or a different arrangement of components.

In the illustrated embodiment, the antenna 1 is used to transmit and receive RF signals. Although an example of a shared antenna is depicted, the teachings herein are also applicable to RF communication systems using separate antennas for transmit and receive.

As shown in FIG. 1, the antenna 1 is coupled to an antenna port of the antenna access component 2, which can correspond to a transmit/receive (T/R) switch, a duplexer, and/or any other circuitry suitable for controlling access to the antenna 1. The antenna access component 2 further includes a receive port coupled to an input of the RF limiting system 3, and a transmit port coupled to an output of the power amplifier 10.

The RF limiting system 3 is coupled between the receive port of the antenna access component 2 and an input to the LNA 4, and serves to provide signal limiting. The RF limiting system 3 can be implemented in accordance with any of the embodiments herein. The limiter 3 can aid in protecting against a wide variety of large signal conditions, including a jammer signal and/or RF leakage arising from finite isolation between the transmit port and the receive port of the antenna access component 2, as depicted in FIG. 1. The RF limiting system 3 limits an RF receive signal to generate a limited RF receive signal.

The LNA 4 serves to amplify the limited RF receive signal to generate an amplified RF receive signal, which is provided to the downconverting mixer 5. The downconverting mixer 5 downconverts the amplified RF receive signal based on a frequency of the local oscillator 7 to generate a downconverted signal. The low pass filter 8 filters the downconverted signal to generate a data output signal, which can be digitized by an analog-to-digital converter (ADC) and thereafter processed using a baseband processor or other suitable circuitry.

The upconverting mixer 8 operates to upconvert a data output signal based on the frequency of the local oscillator 7. In certain implementations, a baseband processor generates digital transmit data, which is converted to an analog format by a digital-to-analog converter (DAC) to generate the data output signal. The upconverted RF transmit signal from the upconverting mixer 8 is filtered by the bandpass filter 9 to generate a filtered RF transmit signal. The power amplifier 10 amplifies the filtered RF transmit signal to generate an amplified RF transmit signal for transmission on the antenna 1.

The RF transceiver 20 can operate using signals associated with a variety of communication standards, including, for example, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Moreover, the RF transceiver 20 can operate using signals of a variety of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Figure 2A:
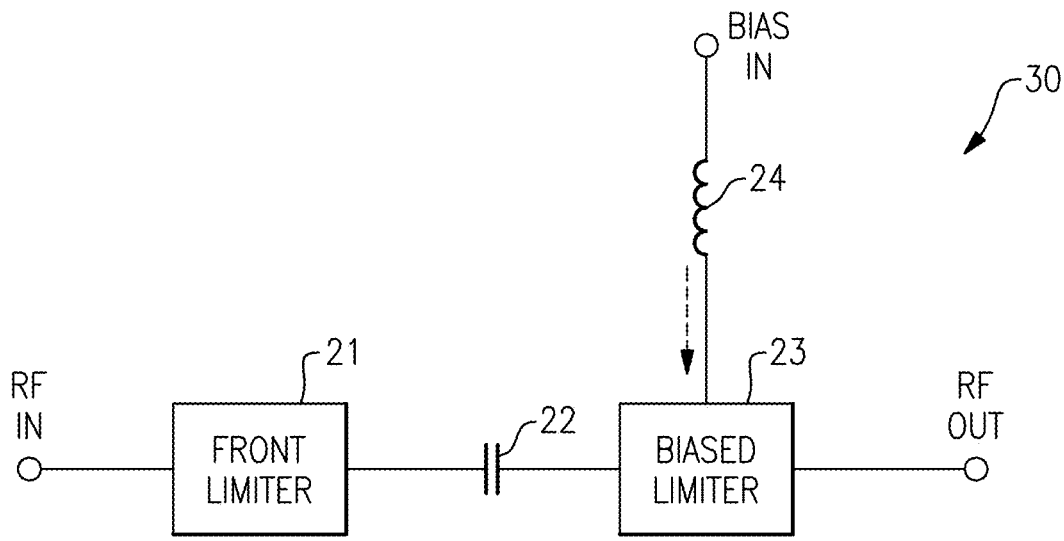
FIG. 2A is a schematic diagram of an RF signal limiting system according to one embodiment.

FIG. 2A is a schematic diagram of an RF signal limiting system 30 according to one embodiment. The RF signal limiting system 30 includes a front limiter 21, a DC blocking capacitor 22, a biased limiter 23, and a choke inductor 24.

As shown in FIG. 2A, the front limiter 21, the DC blocking capacitor 22, and the biased limiter 23 are connected in cascade between an RF input (RF IN) and an RF output (RF OUT). Additionally, the front limiter 21 provides an initial or first amount of limiting to an RF signal received on the RF input to generate a limited RF signal. The limited RF signal passes through the DC blocking capacitor 22 to reach the biased limiter 23, which further limits the limited RF signal to generate an RF output signal at the RF output.

With continuing reference to FIG. 2A, the biased limiter 23 is biased by a bias signal received from a bias input (BIAS IN). The bias signal is provided from the bias input to the biased limiter 23 through the choke inductor 24, which serves to provide RF isolation by choking or blocking RF signals. The biased limiter 23 is adaptively biased such that the amount of limiting provided increases in response to an increase in the RF signal level.

By implementing the RF signal limiting system 30 with both the front limiter 21 and the biased limiter 23, robust signal limiting with low insertion loss is achieved. For example, the front limiter 21 serves to provide initial RF signal limiting, while the biased limiter 23 fail-safes the front limiter 21 by providing additional limiting that increases with the RF signal level. Providing limiting in this manner aids in achieving a flat leakage response in which output power saturates at a certain input power.

In the illustrated embodiment, the DC blocking capacitor 22 is included between the front limiter 21 and the biased limiter 23. By including the DC blocking capacitor 22, adaptive biasing of the biased limiter 23 has little to no impact on operation of the front limiter 21, which can have fixed bias.

Figure 2B:
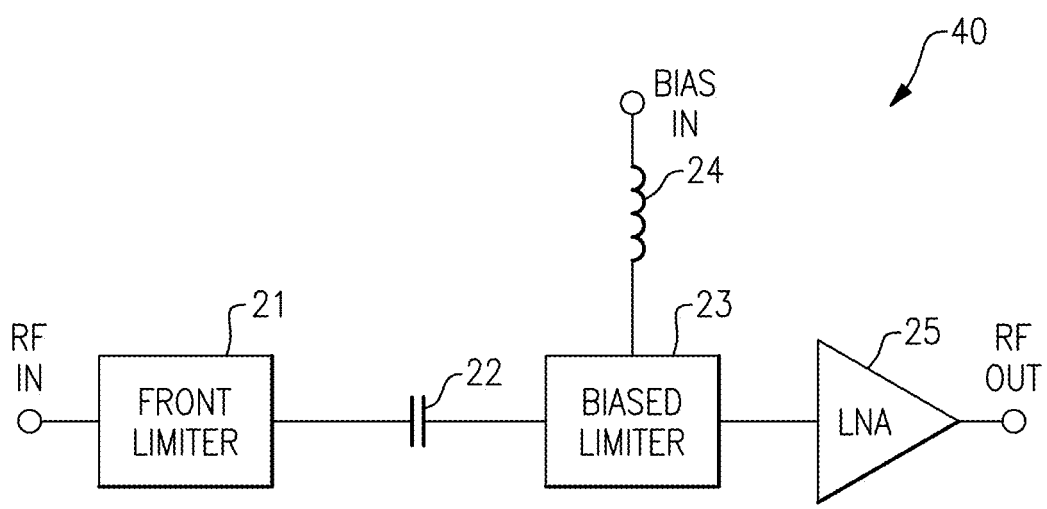
FIG. 2B is a schematic diagram of an RF amplification system with signal limiting according to one embodiment.

FIG. 2B is a schematic diagram of an RF amplification system 40 with signal limiting according to one embodiment. The RF amplification system 40 of FIG. 2B includes a front limiter 21, a DC blocking capacitor 22, a biased limiter 23, a choke inductor 24, and an LNA 25.

The RF amplification system 40 of FIG. 2B is similar to the RF signal limiting system 30 of FIG. 2A, except that the RF amplification system 40 of FIG. 2B further includes the LNA 25 between the biased limiter 23 and the RF output (RF OUT).

In the illustrated embodiment, the front limiter 21 and the biased limiter 23 serve to provide signal limiting to protect an input of the LNA 25. Thus, the LNA 25 and circuitry downstream from the LNA 25 are protected from large RF signals received at the RF input (RF IN).

Figure 3:
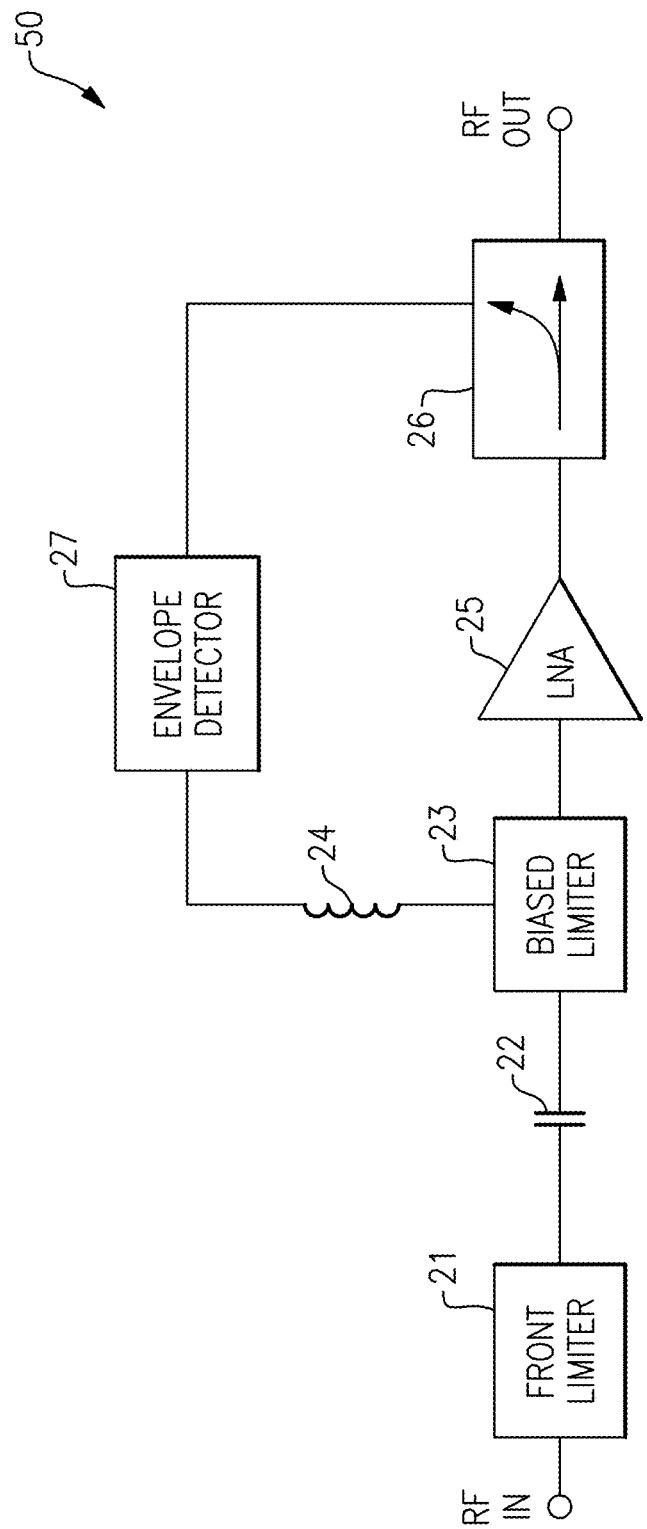
FIG. 3 is a schematic diagram of an RF amplification system with signal limiting according to another embodiment.

FIG. 3 is a schematic diagram of an RF amplification system 50 with signal limiting according to another embodiment. The RF amplification system 50 includes a front limiter 21, a DC blocking capacitor 22, a biased limiter 23, a choke inductor 24, an LNA 25, an RF coupler 26, and an envelope detector 27.

The RF amplification system 50 of FIG. 3 is similar to the RF amplification system 40 of FIG. 2B, except that the RF amplification system 50 further includes the RF coupler 26 and the envelope detector 27.

As shown in FIG. 3, the RF coupler 26 is connected between an output of the LNA 25 and an RF output (RF OUT), and generates a sensed RF signal that is provided to an input of the envelope detector 27. In certain implementations, the RF coupler 26 corresponds to a directional coupler having a through line connected between the output of the LNA 25 and the RF output, and a coupled line which is electromagnetically coupled to the through line and serves to generate the sensed RF signal.

The envelope detector 27 receives the sensed RF signal, and generates a bias signal for the biased limiter 23 that changes in relation to an envelope of the sensed RF signal. Thus, the biased limiter 23 is biased in relation to an envelope of the sensed RF signal. Accordingly, as the RF signal level increases, the bias current of the biased limiter 23 rises to increase the amount of limiting provided by the biased limiter 23. Likewise, as the RF signal level decreases, the bias current of the biased limiter 23 lowers to decrease the amount of limiting provided by the biased limiter 23.

Thus, the output of the LNA 25 is tapped through the RF coupler 26 and fed to envelope detector 27. The envelope detector 27 rectifies or otherwise processes the sensed RF signal to control the bias of the biased limiter 23. At high input signal levels the bias signal controls the biased limiter 23 to present a low impedance to the high input signal (for instance, a jamming signal) thereby causing the high input signal to be attenuated, reflected back, and/or otherwise limited.

In the illustrated embodiment, feedback is used to control the biased limiter 23. Since the RF coupler 26 is after the LNA 25, the loss associated with the RF coupler 26 does not impact the overall noise figure. In certain implementations, the RF coupler 26 is implemented as part of an output matching network of the RF amplification system 60.

Furthermore, by using dynamic bias, a high degree of limiting can be achieved using a relatively small number of limiting components.

Figure 4:
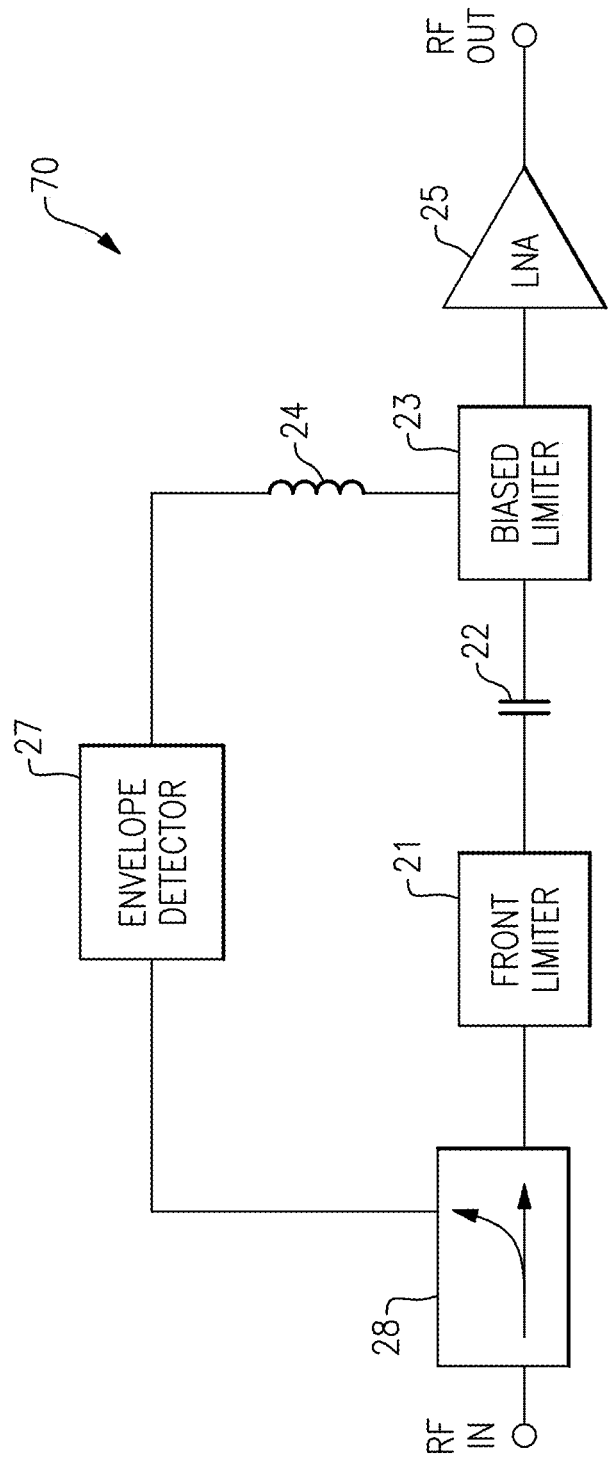
FIG. 4 is a schematic diagram of an RF amplification system with signal limiting according to another embodiment.

FIG. 4 is a schematic diagram of an RF amplification system 70 with signal limiting according to another embodiment. The RF amplification system 70 includes a front limiter 21, a DC blocking capacitor 22, a biased limiter 23, a choke inductor 24, an LNA 25, an envelope detector 27, and an RF coupler 28.

The RF amplification system 70 of FIG. 4 is similar to the RF amplification system 60 of FIG. 3, except that the RF amplification system 70 includes the RF coupler 28 between the RF input (RF IN) and the front limiter 21, rather than the RF coupler 28 between the LNA 25 and the RF output (OUT).

Accordingly, the RF amplification system 70 of FIG. 4 is implemented with a feedforward mechanism for sensing RF signal level, rather than a feedback mechanism as in FIG. 3.

In certain implementations, the RF coupler 28 is implemented as part of an input matching network of the RF amplification system 70.

FIGS. 5A-5D illustrate various examples of envelope detectors that can be used in accordance with the biased limiters herein. Although various examples of envelope detectors are depicted, the teachings herein are applicable to envelope detectors implemented in a wide variety of ways. Accordingly, other implementations are possible.

Figure 5A:
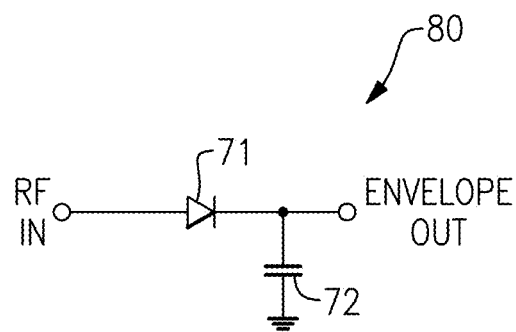
FIG. 5A is a schematic diagram of an envelope detector according to one embodiment.

FIG. 5A is a schematic diagram of an envelope detector 80 according to one embodiment. The envelope detector 80 includes a diode 71 and a capacitor 72. Additionally, an anode of the diode 71 receives an RF input signal from an RF input, while a cathode of the diode 71 provides a rectified RF signal to the capacitor 72. A voltage across the capacitor 72 serves to provide an envelope signal at an envelope output. The envelope signal corresponds to a DC or baseband signal that changes in relation to the envelope of the RF input signal.

Figure 5B:
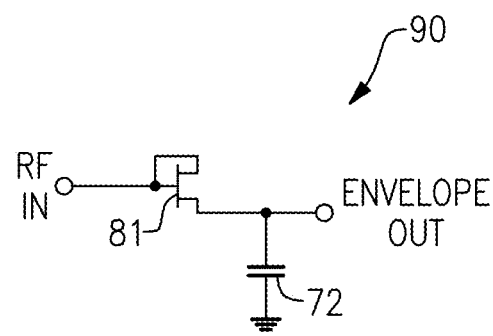
FIG. 5B is a schematic diagram of an envelope detector according to another embodiment.

FIG. 5B is a schematic diagram of an envelope detector 90 according to another embodiment. The envelope detector 90 includes a diode-connected field-effect transistor (FET) 81 and a capacitor 72.

The envelope detector 90 of FIG. 5B is similar to the envelope detector 80 of FIG. 5A, except that the envelope detector 90 of FIG. 5B includes the diode-connected FET 81 rather than the diode 71.

In certain implementations, the FETs depicted herein can correspond to metal-oxide-semiconductor (MOS) transistors. However, other implementations are possible, such as implementations in which the FETs correspond to high electron mobility transistors (HEMTs) fabricated using a compound semiconductor technology, such as a GaAs or GaN. A HEMT can also be referred to as a modulation-doped field effect transistor (MODFET) or a heterojunction field effect transistor (HFET).

Figure 5C:
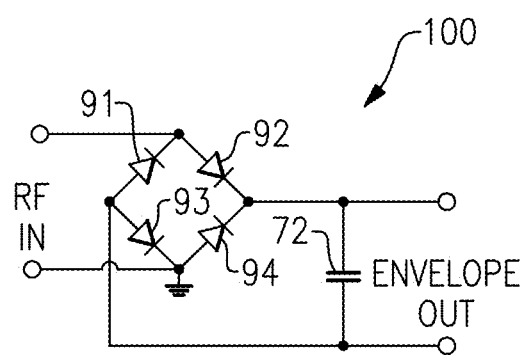
FIG. 5C is a schematic diagram of an envelope detector according to another embodiment.

FIG. 5C is a schematic diagram of an envelope detector 100 according to another embodiment. The envelope detector 100 includes a first diode 91, a second diode 92, a third diode 93, a fourth diode 94, and a capacitor 72.

In contrast to the envelope detector 80 of FIG. 5A that provides half wave rectification, the envelope detector 100 of FIG. 5C includes additional diodes to provide full wave rectification.

Figure 5D:
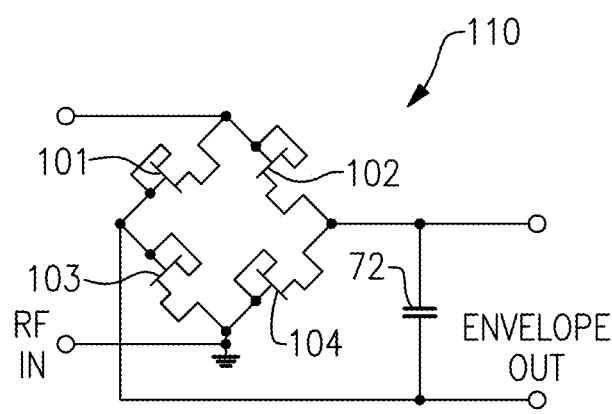
FIG. 5D is a schematic diagram of an envelope detector according to another embodiment.

FIG. 5D is a schematic diagram of an envelope detector 110 according to another embodiment. The envelope detector 110 includes a first diode-connected FET 101, a second diode-connected FET 102, a third diode-connected FET 103, a fourth diode-connected FET 104, and a capacitor 72.

The envelope detector 110 of FIG. 5D is similar to the envelope detector 100 of FIG. 5C, except that the envelope detector 110 of FIG. 5D includes the diode-connected FETs 101-104 rather than the diodes 91-94.

Figure 6A:
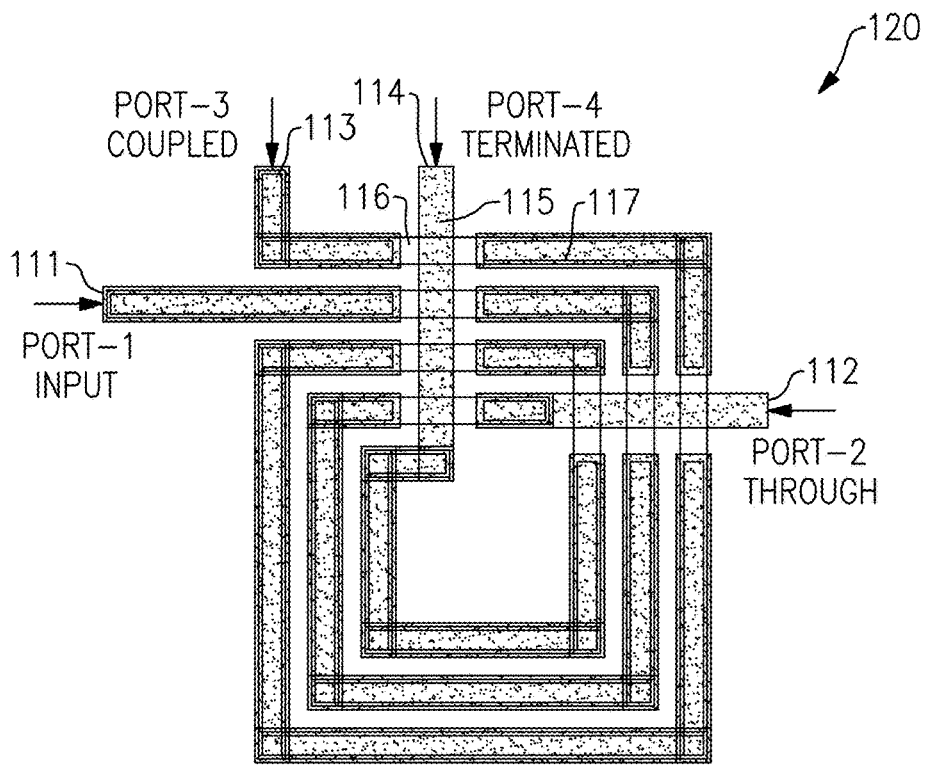
FIG. 6A is a plan view of a layout of an RF coupler according to one embodiment.

FIG. 6A is a plan view of a layout of an RF coupler 120 according to one embodiment. The RF coupler 120 includes a first port 111 (input port), a second port 112 (through port), a third port 113 (coupled port), and a fourth port 114 (terminated port).

The RF coupler 120 corresponds to a directional coupler including a through line connected between the first port 111 and the second port 112, and a coupled line inductively coupled to the through line and connected between the third port 113 and the fourth port 114.

As shown in FIG. 6A, the through line and the coupled line are formed using metallization that includes a first metal layer 115 (for instance, metal one or M1), a second metal layer 116 (for instance, metal two or M2), and vias 117 connecting portions of the first metal layer 115 to portions of the second metal layer 116. In particular, the through line and the coupled line are formed by interleaving arms of two rectangular inductors.

In contrast to a conventional directional coupler, the RF coupler 120 of FIG. 6A does not require a 50 ohm load, and thus the fourth port 114 can be grounded while the third port 113 can be connected (for instance, directly) to an input of an envelope detector. Additionally, the through line can be connected along the RF signal path, for instance, between an output of an LNA and an RF output for a feedback configuration, or between an RF input and a front limiter for a feedforward configuration.

Figure 6B:
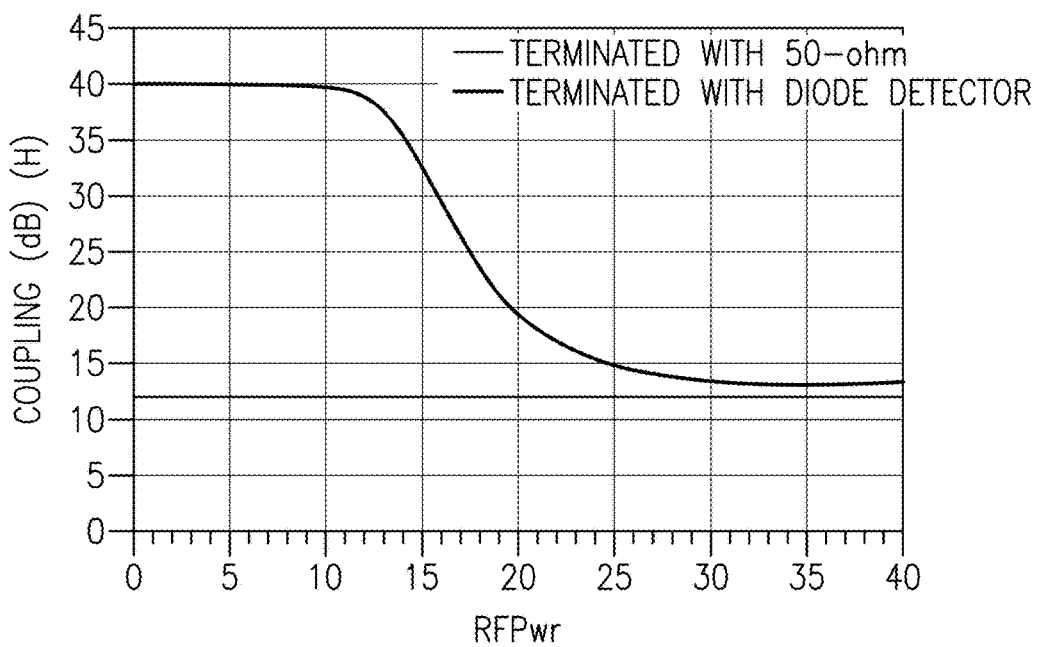
FIG. 6B is a graph of one example of coupling versus input power.

FIG. 6B is a graph of one example of coupling versus input power. The graph includes a first plot of performance of the RF coupler 120 of FIG. 6A with the fourth port 114 ground and the third port 113 connected to a 50 ohm resistor, and a second plot of performance of the RF coupler 120 of FIG. 6A with the fourth port 114 grounded and the third port 113 connected to an input of a diode-based envelope detector (for example, the envelope detector 80 of FIG. 5A).

As shown in FIG. 6B, at low power levels, the envelope detector acts as a high resistor that reduces the power coupled from the RF coupler 120. This in turn reduces insertion loss of the RF coupler 120 during normal operating conditions. At high power levels, the envelope detector provides low resistance, which increases the power coupled from the RF coupler 120.

Accordingly, when used in the RF limiting systems herein in combination with an envelope detector, the RF coupler provides performance enhancement by providing low insertion loss at low power levels (normal operation) and high coupling at high power levels.

Figure 7A:
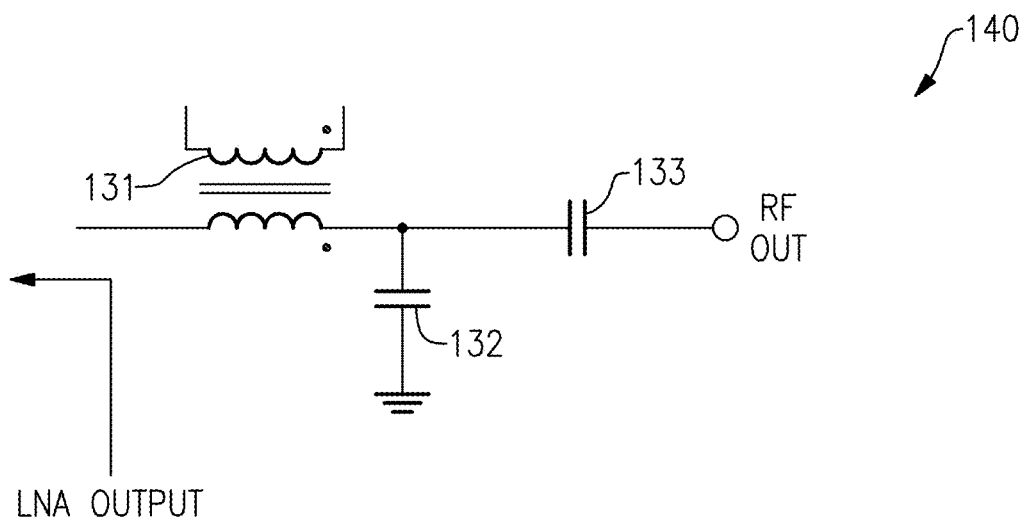
FIG. 7A is a schematic diagram of an output matching network according to one embodiment.

FIG. 7A is a schematic diagram of an output matching network 140 according to one embodiment. The output matching network 140 includes an RF coupler 131, a shunt matching capacitor 132, and a series matching capacitor 133.

At low power levels, the through arm of the RF coupler 131 acts as a series inductor. In the illustrated embodiment, the series inductance of the through arm of the RF coupler 131 is used to provide output matching to an LNA. For example, the inductance of the through arm of the RF coupler 131 can operate in combination with the shunt matching capacitor 132 and the series matching capacitor 133 to provide output matching.

Accordingly, with respect to RF signal limiting using a feedback topology (for example, FIG. 3), the RF coupler 131 can be used not only to generate a sensed RF signal for an envelope detector, but also act as part of an output matching network. Implementing the RF coupler 131 in this manner reduces insertion loss and improves noise figure.

Figure 7B:
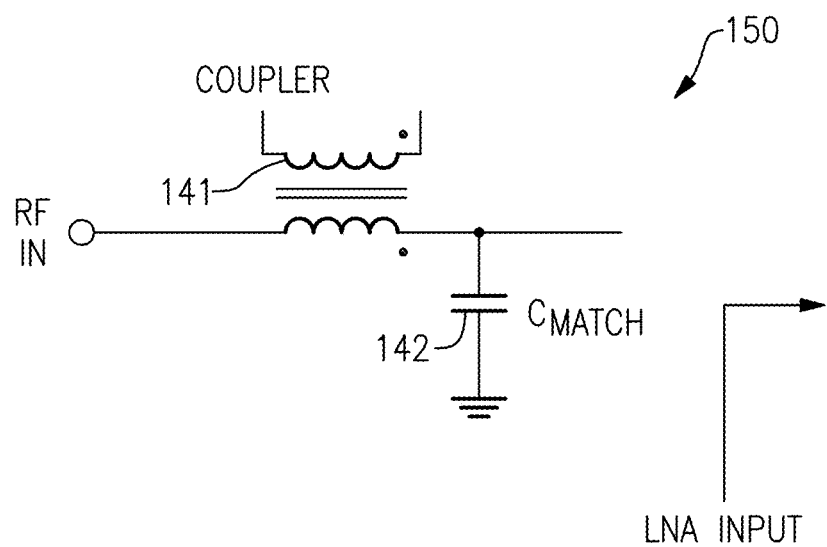
FIG. 7B is a schematic diagram of an input matching network according to one embodiment.

FIG. 7B is a schematic diagram of an input matching network 150 according to one embodiment. The input matching network 150 includes an RF coupler 141 and a shunt matching capacitor 142.

At low power levels, the through arm of the RF coupler 141 acts as a series inductor. In the illustrated embodiment, the series inductance of the through arm of the RF coupler 141 is used to provide input matching to an LNA and/or front limiter. For example, the inductance of the through arm of the RF coupler 141 can operate in combination with the shunt matching capacitor 142 to provide input matching.

Accordingly, with respect to RF signal limiting using a feedforward topology (for example, FIG. 4), the RF coupler 141 can be used not only to generate a sensed RF signal for an envelope detector, but also act as part of an input matching network. Implementing the RF coupler 141 in this manner reduces insertion loss and improves noise figure.

FIGS. 8A-9B depict various embodiments of limiters. Although various examples of limiters are shown, the front limiters and biased limiters herein can be implemented in a wide variety of ways. Accordingly, other implementations are possible.

Figure 8A:
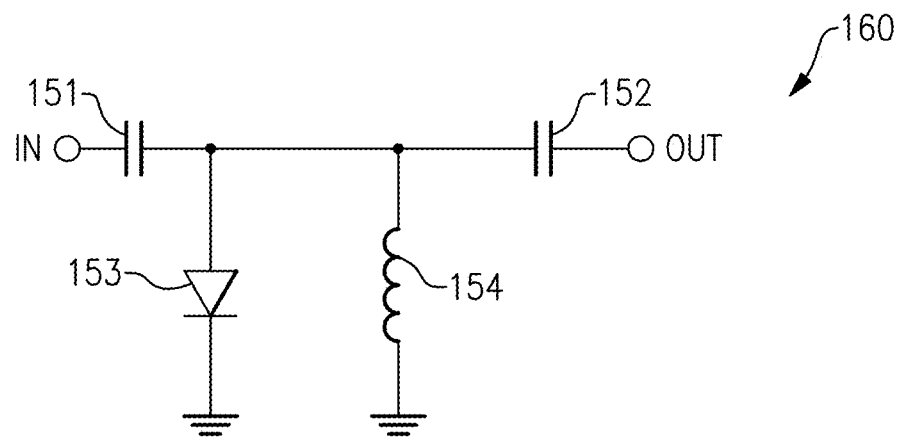
FIG. 8A is a schematic diagram of a front limiter according to one embodiment.

FIG. 8A is a schematic diagram of a front limiter 160 according to one embodiment. The front limiter 160 includes an input DC blocking capacitor 151, an output DC blocking capacitor 152, a shunt diode 153, and a shunt inductor 154.

The shunt diode 153 serves to rectify an RF signal at high signal levels. In certain implementations, the shunt diode 153 is implemented as a p-i-n diode or a Schottky diode. However, other implementations are possible. The shunt inductor 154 serves to bias an anode of the shunt diode 153.

Although a single stage is shown, in certain implementations, a front limiter includes a cascade of multiple components (for instance, shunt diodes). Furthermore, the teachings herein are applicable to stacked configurations of limiting components, such as diodes. Such stacking is applicable to both single stage and multiple stage configurations.

Furthermore, although an embodiment with DC blocking capacitors are shown, the teachings herein are also applicable to implementations without DC blocking capacitors. For example, certain RF communication systems operate with externally controlled DC biasing.

Figure 8B:
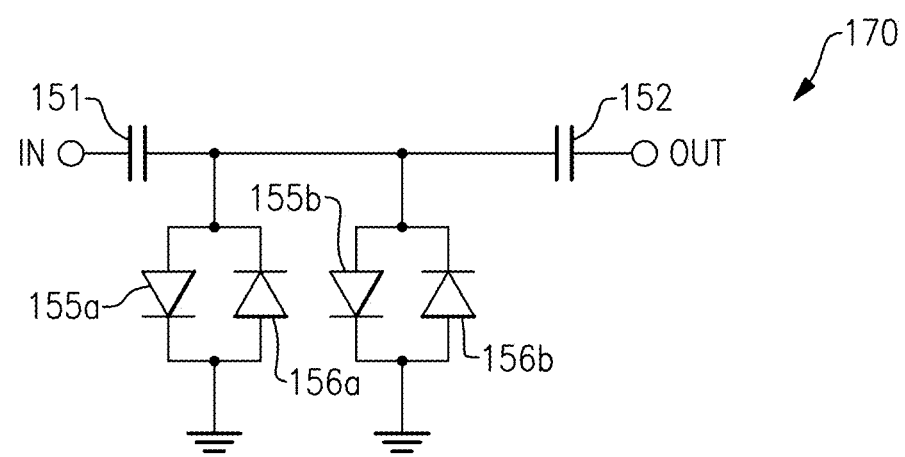
FIG. 8B is a schematic diagram of a front limiter according to another embodiment.

FIG. 8B is a schematic diagram of a front limiter 170 according to another embodiment. The front limiter 170 includes an input DC blocking capacitor 151, an output DC blocking capacitor 152, a first pair of anti-parallel diodes 155a/156a, and a second pair of anti-parallel diodes 155b/156b.

The pairs of anti-parallel diodes serve to provide RF signal limiting. Although two pairs of anti-parallel diodes is shown, more or fewer pairs of anti-parallel diodes can be included.

In comparison to the configuration of FIG. 8A, the anti-parallel limiter of FIG. 8B provides higher insertion loss, but improved flat leakage.

Figure 9A:
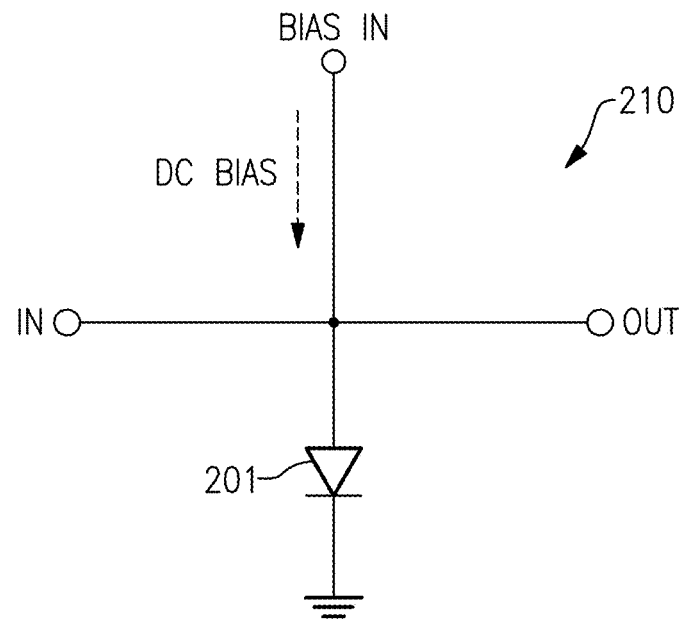
FIG. 9A is a schematic diagram of a biased limiter according to one embodiment.

FIG. 9A is a schematic diagram of a biased limiter 210 according to one embodiment. The biased limiter 210 includes a shunt diode 201 connected in shunt to an RF signal path running between a signal input IN and a signal output OUT. The shunt diode 201 receives bias signal from a bias input BIAS. In certain implementations, the bias input BIAS is connected to an output of an envelope detector through a choke inductor. The shunt diode 201 can be implemented in a variety of ways, including, but not limited to, a p-i-n diode or a Schottky diode.

Figure 9B:
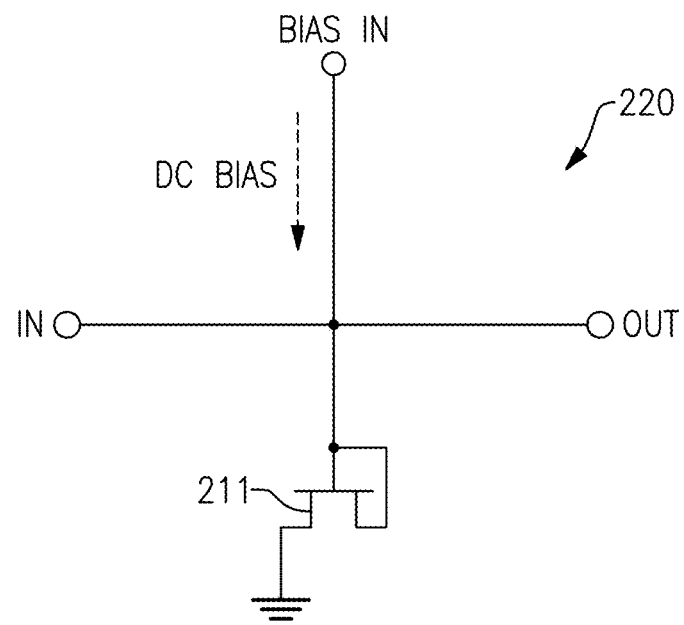
FIG. 9B is a schematic diagram of a biased limiter according to another embodiment.

FIG. 9B is a schematic diagram of a biased limiter 220 according to another embodiment. The biased limiter 220 includes a diode-connected FET 211 connected in shunt to an RF signal path running between a signal input IN and a signal output OUT. The diode-connected FET 211 is biased by a bias terminal from a bias input BIAS.

The diode-connected FET 211 can be implemented in a variety of ways. In one embodiment, the FET 211 is a HEMT having a metal-semiconductor interface between the gate and channel, such that the HEMT serves as a Schottky diode when diode-connected. However, other implementations are possible.

Figure 10A:
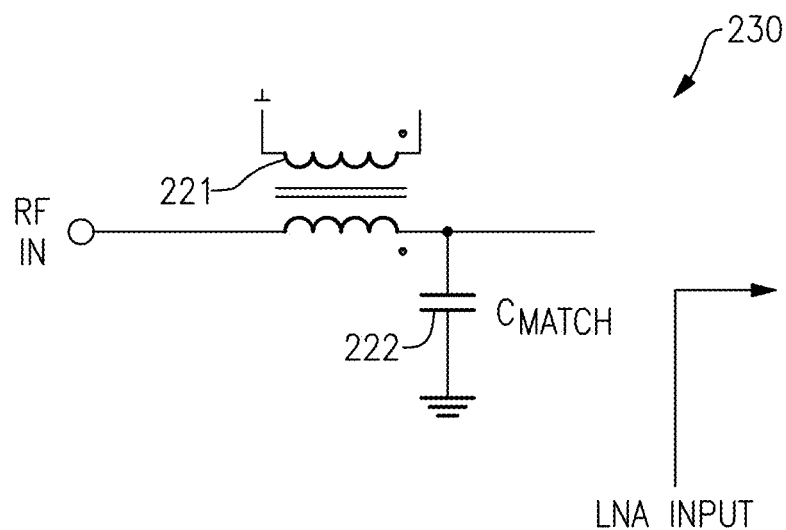
FIG. 10A is a schematic diagram of a low pass network according to one embodiment.
Figure 10B:
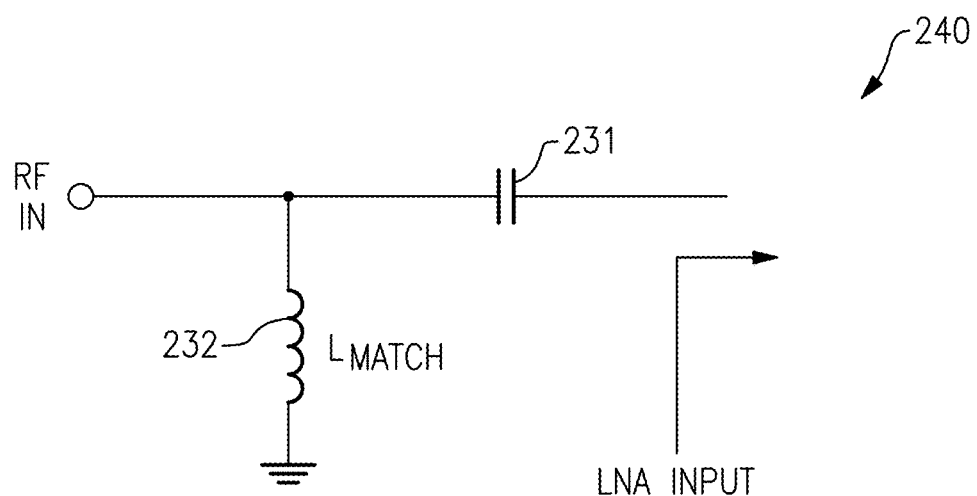
FIG. 10B is a schematic diagram of a high pass network according to one embodiment.

FIGS. 10A and 10B are examples of filtering networks for filtering jamming signals. Any of the embodiments herein can be implemented with a filtering network. For example, such filtering networks can be included along an RF signal path to an input of an LNA, for instance, between an RF input and a front limiter or between a biased limiter and an LNA.

FIG. 10A is a schematic diagram of a low pass network 230 according to one embodiment. The low pass network 230 includes an RF coupler 221 and a shunt capacitor 222, which in certain implementations is also part of an input matching network.

At low power levels, the through arm of the RF coupler 221 acts as a series inductor. In the illustrated embodiment, the series inductance of the through arm of the RF coupler 221 operates in combination with the shunt capacitor 222 to form an LC network that attenuates high frequency jammer signals. Thus, high frequency jamming signals are blocked from reaching an LNA.

Accordingly, with respect to RF signal limiting using a feedforward topology (for example, the embodiment of FIG. 4), the RF coupler 221 can be used not only to generate a sensed RF signal for an envelope detector, but also act as part of a low pass network.

FIG. 10B is a schematic diagram of a high pass network 240 according to one embodiment. The high pass network 240 includes a shunt inductor 232 and a series capacitor 231, which can be a DC blocking capacitor.

In the illustrated embodiment, the shunt inductor 232 and the series capacitor 231 form an LC network that attenuates low frequency jammer signals. Thus, low frequency jamming signals are blocked from reaching an LNA. In certain implementations, the shunt inductor 232 and/or the series capacitor 231 are also used for input matching, as well as to attenuate low frequency jammer signals.

Figure 11A:
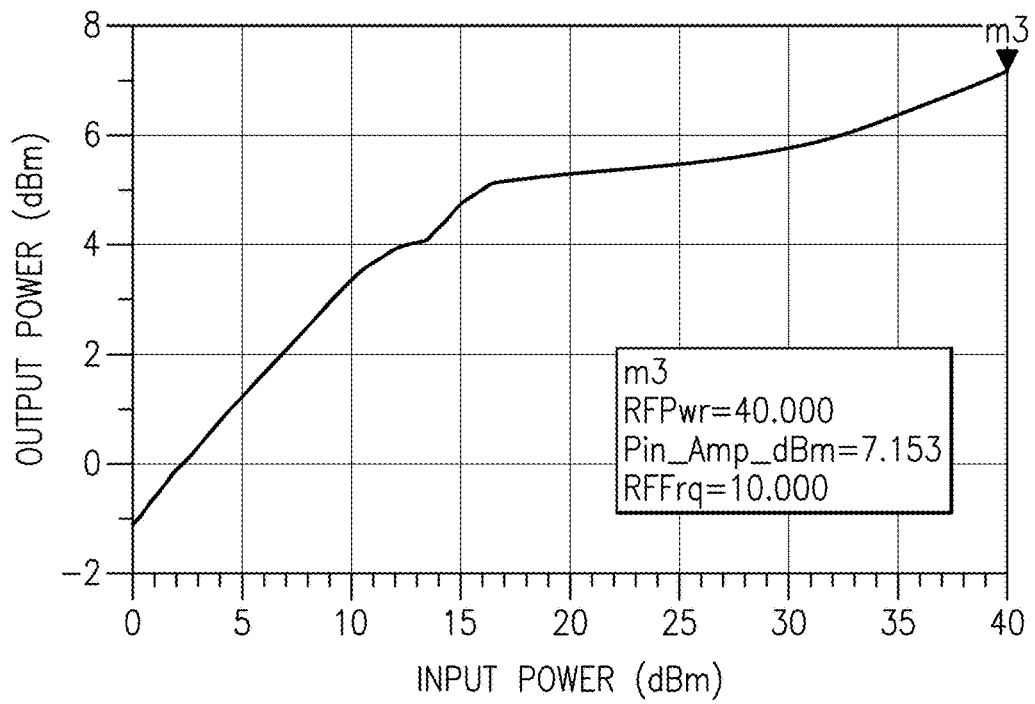
FIG. 11A is a graph of one example of output power versus input power for one embodiment of limiting using feedback biasing.

FIG. 11A is a graph of one example of output power versus input power for one embodiment of limiting using feedback biasing. The graph corresponds to simulation results for an implementation of the embodiment of FIG. 3 in which the front limiter 21 includes three stages of anti-parallel diodes and in which the biased limiter 23 includes a single diode. Compared to a 4-stage static limiter, the flat leakage is about 10 dB to 12 dB lower throughout the high input power region.

Figure 11B:
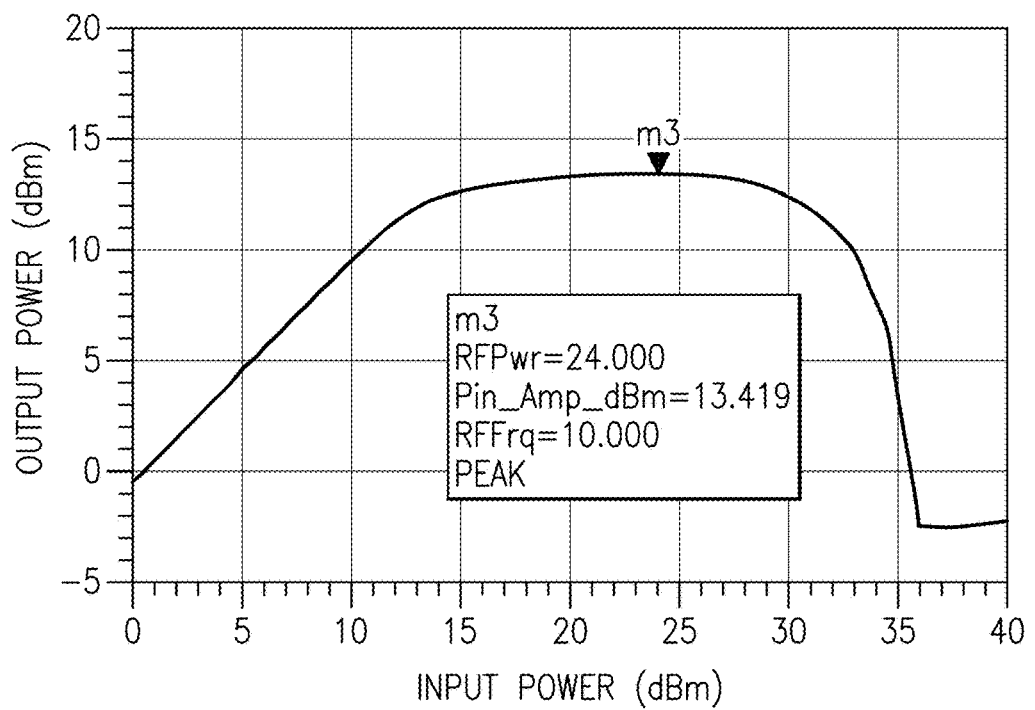
FIG. 11B is a graph of another example of output power versus input power for one embodiment of limiting using feedforward biasing.

FIG. 11B is a graph of another example of output power versus input power for one embodiment of limiting using feedforward biasing. The graph corresponds to simulation results for an implementation of the embodiment of FIG. 4 in which the front limiter 21 includes three stages of anti-parallel diodes and in which the biased limiter 23 includes a single diode. Compared to a 4-stage static limiter, the flat leakage is about 20 dB lower at the peak input level of 40 dBm.

Although various simulation results have been provided above, simulation results can differ based on a wide variety of factors, such as circuit implementation, simulation models, simulation parameters, and/or simulation tools. Accordingly, other simulation results are possible.

APPLICATIONS

Devices employing the above described schemes can be implemented into various electronic devices. Examples of electronic devices include, but are not limited to, RF communication systems, consumer electronic products, electronic test equipment, communication infrastructure, etc. For instance, an LNA with signal limiting can be used in a wide range of RF communication systems, including, but not limited to, base stations, mobile devices (for instance, smartphones or handsets), laptop computers, tablets, and wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency (RF) system with adaptive signal limiting, the RF system comprising:
a front limiter including an input configured to receive an RF signal and an output configured to provide a first limited RF signal;
a biased limiter including an input configured to receive the first limited RF signal and an output configured to provide a second limited RF signal, wherein an amount of limiting provided by the biased limiter is controlled by a bias signal that changes in relation to a signal level of the RF signal;
an RF coupler connected to the input of the front limiter and configured to generate a sensed RF signal; and
an envelope detector configured to receive the sensed RF signal and to generate the bias signal.

2. The RF system of claim 1, further comprising a low noise amplifier (LNA) having an input configured to receive the second limited RF signal and an output configured to provide an amplified RF signal.

3. The RF system of claim 1, further comprising a DC blocking capacitor having a first end connected to the output of the front limiter and a second end connected to the input of the biased limiter.

4. The RF system of claim 1, wherein the RF coupler incudes a through line and a coupled line, wherein an inductance of the through line provides input matching.

5. The RF system of claim 1, wherein the biased limiter includes a diode having an anode configured to receive the bias signal and a cathode connected to a reference voltage.

6. The RF system of claim 1, wherein the biased limiter includes a field-effect transistor having a source and a gate connected to one another and configured to receive the bias signal, and a drain connected to a reference voltage.

7. The RF system of claim 1, wherein the envelope detector is configured to control the bias signal in relation to an envelope of the RF signal.

8. The RF system of claim 7, wherein the envelope detector includes a rectifier and a capacitor, wherein the rectifier includes at least one of a diode or a diode-connected FET.

9. The RF system of claim 1, further comprising a filtering network connected to the input of the front limiter and configured to provide one of high pass filtering or low pass filtering to the RF signal.

10. The RF system of claim 1, wherein the front limiter includes at least one pair of anti-parallel diodes.

11. The RF system of claim 1, wherein the front limiter includes a shunt diode configured to limit the RF signal and a shunt inductor configured to bias the shunt diode.

12. A radio frequency (RF) system with adaptive signal limiting, the RF system comprising:
a front limiter including an input configured to receive an RF signal and an output configured to provide a first limited RF signal;

a biased limiter including an input configured to receive the first limited RF signal and an output configured to provide a second limited RF signal, wherein an amount of limiting provided by the biased limiter is controlled by a bias signal that changes in relation to a signal level of the RF signal;

a low noise amplifier (LNA) having an input configured to receive the second limited RF signal and an output configured to provide an amplified RF signal;

an RF coupler connected to the output of the LNA and configured to generate a sensed RF signal; and an envelope detector configured to receive the sensed RF signal and to generate the bias signal.

13. The RF system of claim 12, wherein the RF coupler incudes a through line and a coupled line, wherein an inductance of the through line provides output matching to the LNA.

14. The RF system of claim 12, wherein the biased limiter includes a field-effect transistor having a source and a gate connected to one another and configured to receive the bias signal, and a drain connected to a reference voltage.

15. The RF system of claim 12, further comprising a DC blocking capacitor having a first end connected to the output of the front limiter and a second end connected to the input of the biased limiter.

16. The RF system of claim 12, further comprising a filtering network connected to the input of the front limiter and configured to provide one of high pass filtering or low pass filtering to the RF signal.

17. The RF system of claim 12, wherein the front limiter includes at least one pair of anti-parallel diodes.

18. The RF system of claim 12, wherein the front limiter includes a shunt diode configured to limit the RF signal and a shunt inductor configured to bias the shunt diode.

19. A radio frequency (RF) system with adaptive signal limiting, the RF system comprising:

a front limiter including an input configured to receive an RF signal and an output configured to provide a first limited RF signal;

a biased limiter including an input configured to receive the first limited RF signal and an output configured to provide a second limited RF signal, wherein an amount of limiting provided by the biased limiter is controlled by a bias signal that changes in relation to a signal level of the RF signal;

an envelope detector configured to control the bias signal in relation to an envelope of the RF signal; and an RF coupler configured to provide a sensed RF signal to the envelope detector, wherein the RF coupler is implemented to have a coupling factor that decreases with power level.

20. The RF system of claim 19, wherein the biased limiter includes a field-effect transistor having a source and a gate connected to one another and configured to receive the bias signal, and a drain connected to a reference voltage.

* * * * *